United States Patent
Horiuchi et al.

(10) Patent No.: US 9,443,995 B2
(45) Date of Patent: Sep. 13, 2016

(54) SOLAR BATTERY CELL AND SOLAR BATTERY MODULE

(71) Applicant: Hitachi Chemical Company, Ltd., Tokyo (JP)

(72) Inventors: Takeshi Horiuchi, Ibaraki (JP); Kenzou Takemura, Ibaraki (JP); Yusuke Asakawa, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 13/950,500

(22) Filed: Jul. 25, 2013

(65) Prior Publication Data

US 2014/0026951 A1    Jan. 30, 2014

Related U.S. Application Data

(60) Provisional application No. 61/675,972, filed on Jul. 26, 2012.

(30) Foreign Application Priority Data

Jul. 26, 2012   (JP) ............................. P2012-165821

(51) Int. Cl.
*H01L 31/044*     (2014.01)
*H01L 31/0224*    (2006.01)
*H01L 31/05*      (2014.01)

(52) U.S. Cl.
CPC ... H01L 31/022433 (2013.01); H01L 31/0504 (2013.01); *Y02E 10/50* (2013.01)

(58) Field of Classification Search
CPC ....... H01L 31/00–31/078; Y02E 10/50–10/60

USPC .................................................. 136/243–265
See application file for complete search history.

(56) References Cited

U.S. PATENT DOCUMENTS

2004/0200522 A1*  10/2004  Fukawa et al. ............... 136/259
2008/0121265 A1*   5/2008  Hishida et al. ............... 136/244

FOREIGN PATENT DOCUMENTS

| CN | 101452981 A | | 6/2009 |
|---|---|---|---|
| CN | 203406296 U | | 1/2014 |
| DE | 102010015970 | * | 9/2011 |
| JP | 08-330615 A | | 12/1996 |
| JP | 2002-263880 A | | 9/2002 |
| JP | 2003-133570 A | | 5/2003 |
| JP | 2004-204256 A | | 7/2004 |
| JP | 2005-243935 A | | 9/2005 |
| JP | 2007-265635 A | | 10/2007 |

OTHER PUBLICATIONS

Office Action issued in corresponding Chinese application 201310287364.8 on Mar. 28, 2016 (no translation available; submitted for certification).

* cited by examiner

*Primary Examiner* — Bach Dinh
(74) *Attorney, Agent, or Firm* — Griffin and Szipl PC

(57) ABSTRACT

To accurately connect a TAB wire to intended positions while preventing an increase in manufacturing costs.

A solar cell battery 100 includes finger electrodes 3. The finger electrodes 3 includes first finger electrodes and second finger electrodes that extend from opposite directions in a direction crossing the finger electrodes 3 to reach a TAB area SF to which a TAB wire 4 is connected.

9 Claims, 10 Drawing Sheets

SOLAR BATTERY CELL AND SOLAR BATTERY MODULE

This application claims priority from U.S. Provisional Patent Application No. 61/675,972 and Japanese Patent Application P2012-165821, both filed Jul. 26, 2012, the entire disclosures of which are incorporated herein by reference.

TECHNICAL FIELD

The present invention relates to a solar battery cell and a solar battery module.

BACKGROUND ART

In recent years, much attention has been paid to solar batteries as means for solving increasingly serious global warming and fossil energy depletion problems. A solar battery is generally formed by connecting a plurality of solar battery cells in series or parallel. The solar battery cell includes a plurality of linear electrodes (finger electrodes) arranged in parallel on the front surface (light receiving surface) thereof and made of Ag in order to provide power. A back surface electrode made of Al is formed all over the back surface of the solar battery cell. Adjacent solar battery cells are connected to each other by connecting a metal wiring member (TAB wire) to the light receiving surface of one of the adjacent solar battery cells orthogonally to the all the finger electrodes and further connecting the TAB wire to the back surface electrode of the other solar battery cell.

CITATION LIST

Patent Literature

[Patent Literature 1] Japanese Patent Application Laid-Open No. 2002-263880
[Patent Literature 2] Japanese Patent Application Laid-Open No. 2004-204256
[Patent Literature 3] Japanese Patent Application Laid-Open No. 8-330615
[Patent Literature 4] Japanese Patent Application Laid-Open No. 2003-133570
[Patent Literature 5] Japanese Patent Application Laid-Open No. 2005-243935
[Patent Literature 6] Japanese Patent Application Laid-Open No. 2007-265635

SUMMARY OF INVENTION

Technical Problem

Solder exhibiting proper conductivity is conventionally used to connect the TAB wire (Patent Literature 1). Furthermore, in some cases, Sn—Ag—Cu solder containing no Pb has recently been used in consideration of environmental problems (Patent Literatures 1 and 2). However, when these solders are used to connect the TAB wire, the solar battery cells are heated at about 220° C. or higher, and thus the yield of the connection step may decrease or the solar battery cells may be warped. To suppress these, silicon in the solar battery cells may be increased in thickness. However, in this case, manufacturing costs increase.

Furthermore, when such solder as described above is used to connect the TAB wire, in order to ensure wettability of the solder, electrodes (bus bar electrodes) made of Ag need to be performed on the front and back surfaces of the solar battery cell at the positions where the TAB wires are located. However, Ag is expensive, thus contributing to increasing manufacturing costs. Additionally, Ag offers low electric resistance, but thin bus bar electrodes offer high sheet resistance. This increases power loss in the bus bar electrodes, thereby reducing the power generation performance of the solar battery cells. Accordingly, to suppress the sheet resistance of the bus bar electrodes, the bus bar electrodes need to be increased in width to some degree. This further increases the manufacturing costs.

Hence, in recent years, a method has been proposed in which a conductive adhesive with a conductive adhesion layer is used instead of the solder to connect the TAB wire (Patent Literatures 3 to 6). The conductive adhesive is a composition of a thermosetting resin in which metal particles such as Ni particles are mixed and dispersed, and the metal particles are sandwiched between the TAB wire and the electrode of the solar battery cell to achieve electric connection. If the conductive adhesive is used to connect the TAB wire, the connection can be performed at 200° C. or lower, and thus a decrease in the yield of the connection step and the warpage of the solar battery cells are suppressed. Furthermore, if the conductive adhesive is used to connect the TAB wire, the wettability need not be ensured and in turn the need for the bus bar electrodes that are formed to ensure the wettability is eliminated, whereby the use of Ag is reduced.

However, if bus bar electrodes are not formed on the front or back surface of the solar battery cell, the position where TAB wires are connected cannot be identified, and thus there is a possibility that the TAB wires cannot be accurately adhered to intended positions. When the TAB wires cannot be adhered to the intended positions, the line of the solar battery cells may meander, thus a residual stress may be generated in the solar battery cells, and the manufacturing yield may decrease. In this case, additional alignment marks for alignment may be formed at the intended adhesion positions. However, a complicated step of forming alignment marks increases the manufacturing costs.

The present invention has been made to solve the above-described problems, and aims to provide a solar battery cell and a solar battery module that make it possible to accurately connect a TAB wire to intended positions while preventing an increase in manufacturing costs.

Solution to Problem

A solar battery cell according to the present invention includes a plurality of finger electrodes arranged on a light receiving surface on a substrate, and the finger electrodes include a plurality of first finger electrodes and a plurality of second finger electrodes extending from opposite sides to reach a TAB area which crosses the finger electrodes and which has TAB wires connected thereto.

In the solar battery cell according to the present invention, with the first finger electrodes and the second finger electrodes reaching to the TAB area from opposite directions, it is possible to render the TAB area visually conspicuous by ends of the first finger electrodes and ends of the second finger electrodes. Accordingly, it is possible to identify the TAB area without additional alignment marks formed, and thus it is possible to accurately connect the TAB wire to intended positions while preventing an increase in the amount of electrode material usage.

It is preferable that the finger electrodes extend in a direction orthogonal to the TAB area. By this, the light collection efficiency of the solar battery cell can be improved.

In the solar battery cell according to the present invention, it is preferable that ends of the first finger electrodes reaching the TAB area and ends of the second finger electrodes reaching the TAB area be aligned on lines parallel to an extending direction of the TAB area. By this, the positions of the ends of the first finger electrodes and the ends of the second finger electrodes can be rendered visually conspicuous as positions parallel to the TAB area. Accordingly, the TAB wire can be arranged in parallel to the TAB area, whereby the TAB wire can be accurately connected to the intended positions.

In the solar battery cell according to the present invention, it is preferable that ends of the first finger electrodes reaching the TAB area and ends of the second finger electrodes reaching the TAB area be positioned at an equal distance from center of the TAB in its width direction. By this positioning, the center of an area sandwiched between the ends of the first finger electrodes and the ends of the second finger electrodes coincides with the center of the TAB area in the width direction, and thus the center of the TAB area in the width direction can be easily identified. Accordingly, the TAB wire can be accurately connected to intended positions.

In the solar battery cell according to the present invention, it is preferable that the first finger electrodes and the second finger electrodes be alternately provided in an extending direction of the TAB area in the TAB area. Even when the first finger electrodes and the second finger electrodes are arranged in this manner, the TAB wire can be accurately connected to the intended positions similarly to the above-described solar battery cell.

In the solar battery cell according to the present invention, it is preferable that the first finger electrodes and the second finger electrodes overlap in the extending direction of the TAB area. In this case, at least a pair of one of the first finger electrodes and one of the second finger electrodes that are adjacent to each other in the extending direction of the TAB area may be in contact with each other, or all the finger electrodes that are adjacent to each other in the extending direction of the TAB area may be separated from each other. With this configuration, by the overlap between the first finger electrodes and the second finger electrodes, the TAB area can be more distinctly displayed, and the TAB wire can be more accurately connected to the intended positions.

In the solar battery cell according to the present invention, it is preferable that length of overlap between the first finger electrodes and the second finger electrodes be equal to or smaller than width of the TAB. With this configuration, the light collection area will not be reduced by the first finger electrodes or the second finger electrodes, and thus it is possible to accurately connect the TAB wire to the intended positions while improving the light collection efficiency.

In the solar battery cell according to the present invention, it is preferable that length of overlap between the first finger electrodes and the second finger electrodes be approximately the same as the width of the TAB area. By this, the overlap between the first finger electrodes and the second finger electrodes coincides with the width of the TAB area, and thus the overlap between the first finger electrodes and the second finger electrodes can be displayed as the width of the TAB area, and the TAB wire can be more accurately connected to the intended positions.

In the solar battery cell according to the present invention, it is preferable that length of overlap between the first finger electrodes and the second finger electrodes be equal to or larger than 10% of width of the TAB area. By this, sufficient width for identifying the position of the TAB area can be ensured, whereby the overlap between the first finger electrodes and the second finger electrodes can be displayed in a visually distinct manner, and the TAB wire can be more accurately connected to the intended positions.

A solar battery module according to the present invention includes a plurality of solar battery cells, each being any of the above-described solar battery cell, and a TAB wire arranged along a TAB area of a predetermined solar battery cell out of the solar battery cells and connected to the first finger electrodes and the second finger electrodes of the predetermined solar battery cell by an adhesive, the TAB wire being further connected to a back surface electrode formed on a back surface of another solar battery cell out of the solar battery cells. In the solar battery module according to the present invention, the TAB wire is accurately connected to the intended positions, and thus it is possible to prevent a line of the solar battery cells from meandering. This can prevent a residual stress from being generated in the solar battery cells when manufacturing the solar battery module, thereby improving the manufacturing yield. In this case, the adhesive can be a conductive adhesive or an insulating adhesive.

Advantageous Effects of Invention

According to the present invention, it is possible to provide a solar battery cell and a solar battery module that make it possible to accurately connect a TAB wire to intended positions while preventing an increase in manufacturing costs.

DESCRIPTION OF EMBODIMENTS

Figure 1:
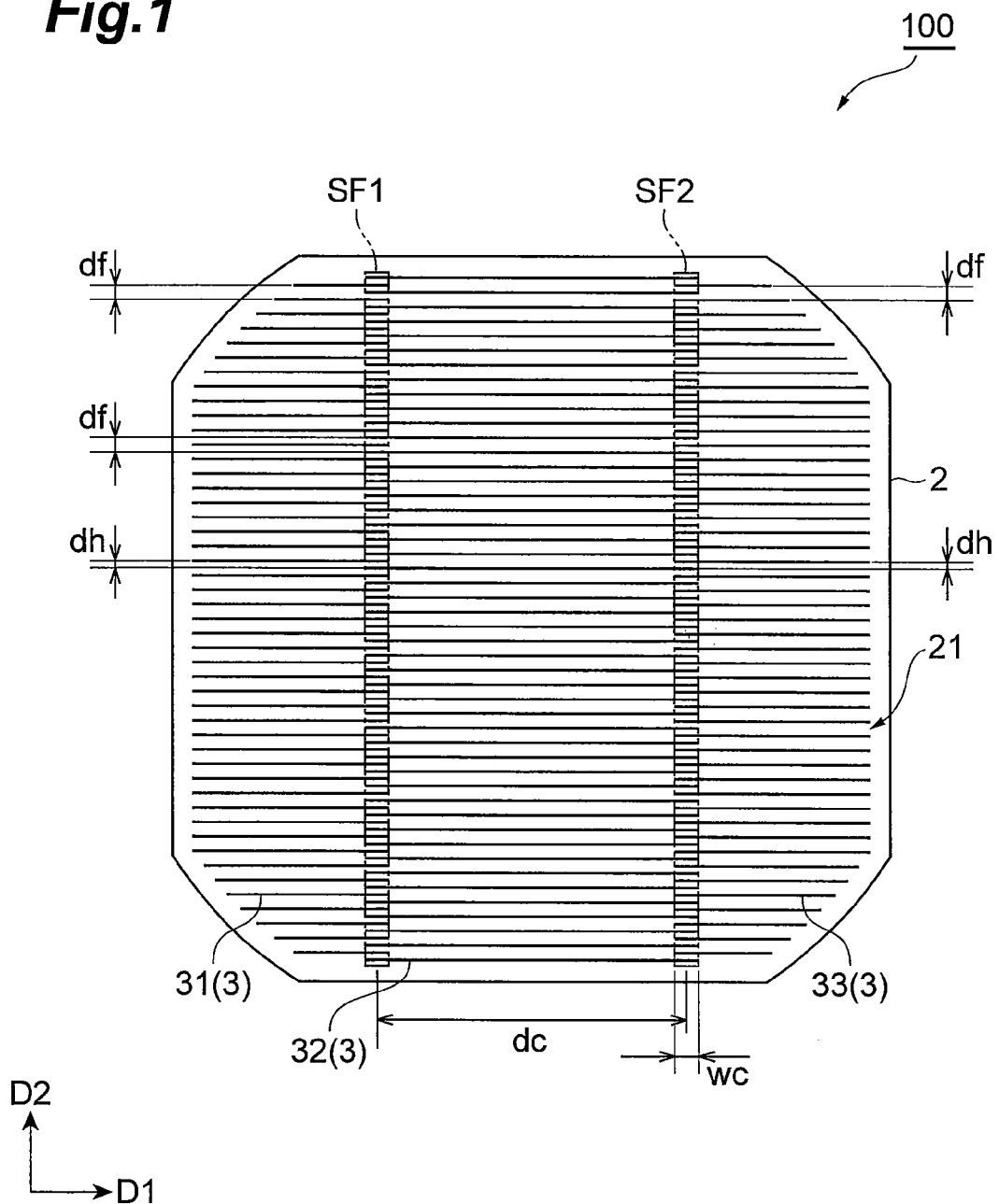
FIG. 1 is a plan view illustrating a light receiving surface of a solar battery cell.

Preferred embodiments of a solar battery cell and a solar battery module according to the present invention will be described below in detail with reference to the drawings. The same reference numerals are given to the same elements, and duplicate explanations are omitted. For illustrative reasons, the dimensional proportions of the drawings do not necessarily match those of the description.

Figure 2:
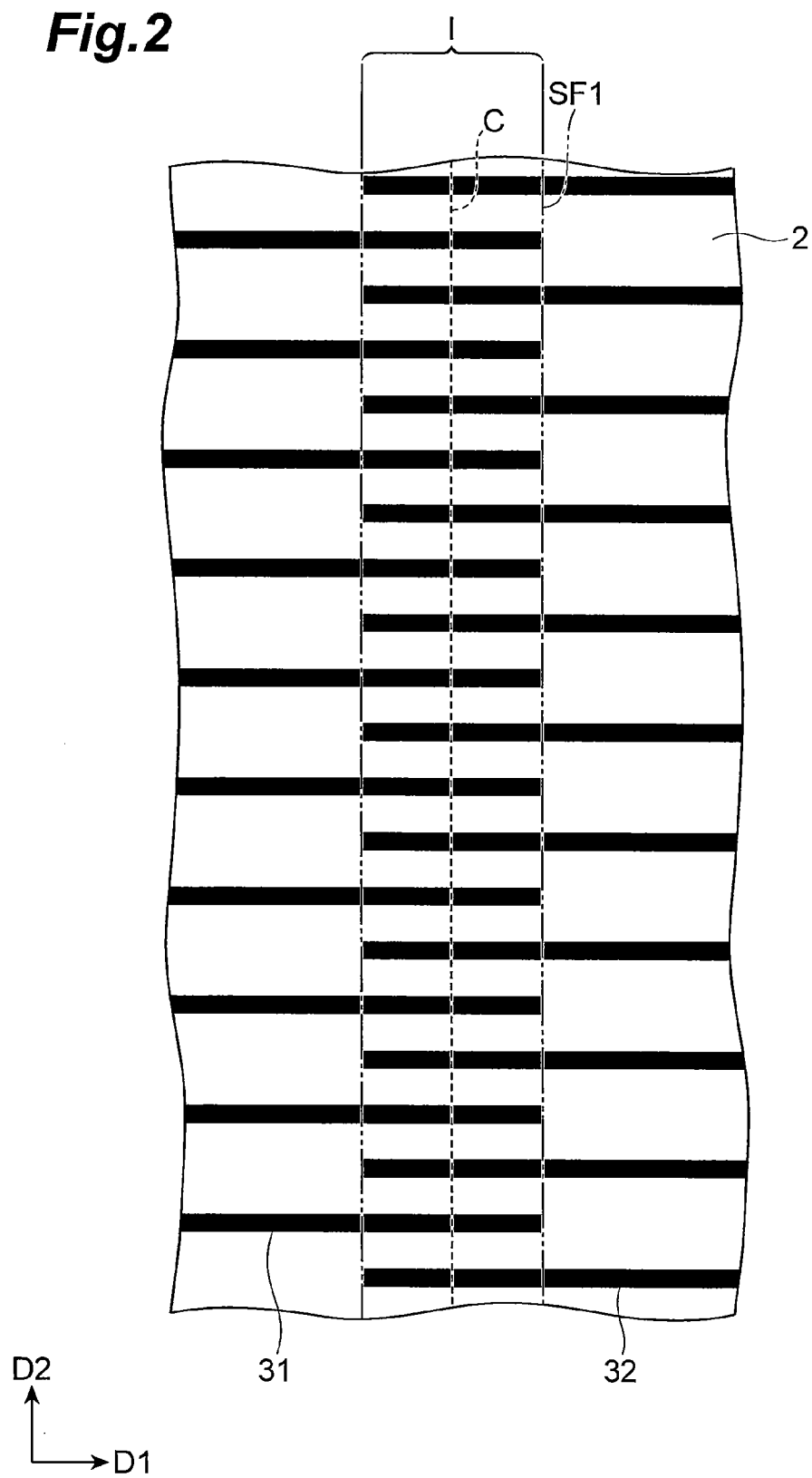
FIG. 2 is a diagram illustrating an enlarged view of a TAB area in FIG. 1.
Figure 3:
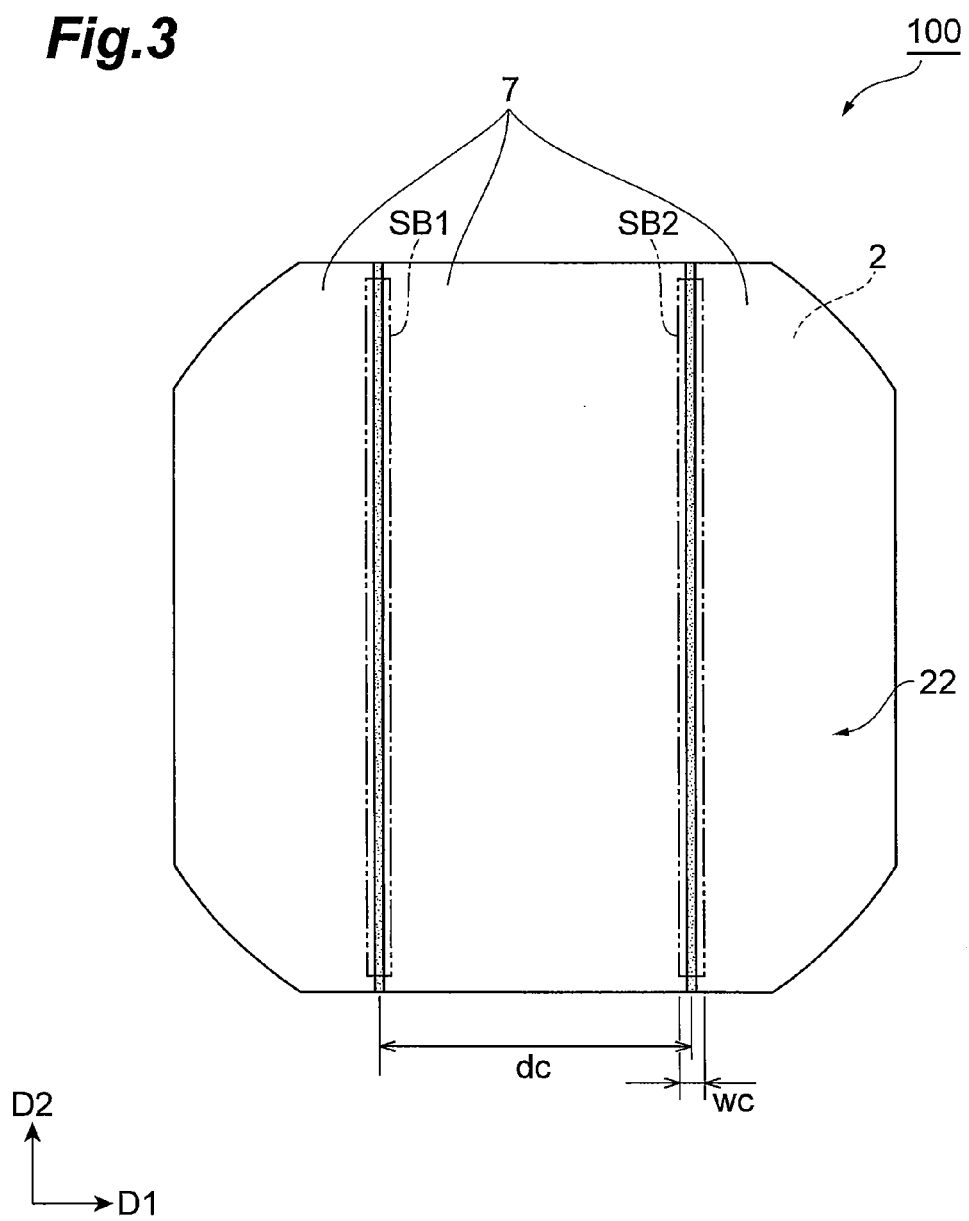
FIG. 3 is a bottom view illustrating the back surface of the solar battery cell in FIG. 1.
Figure 4:
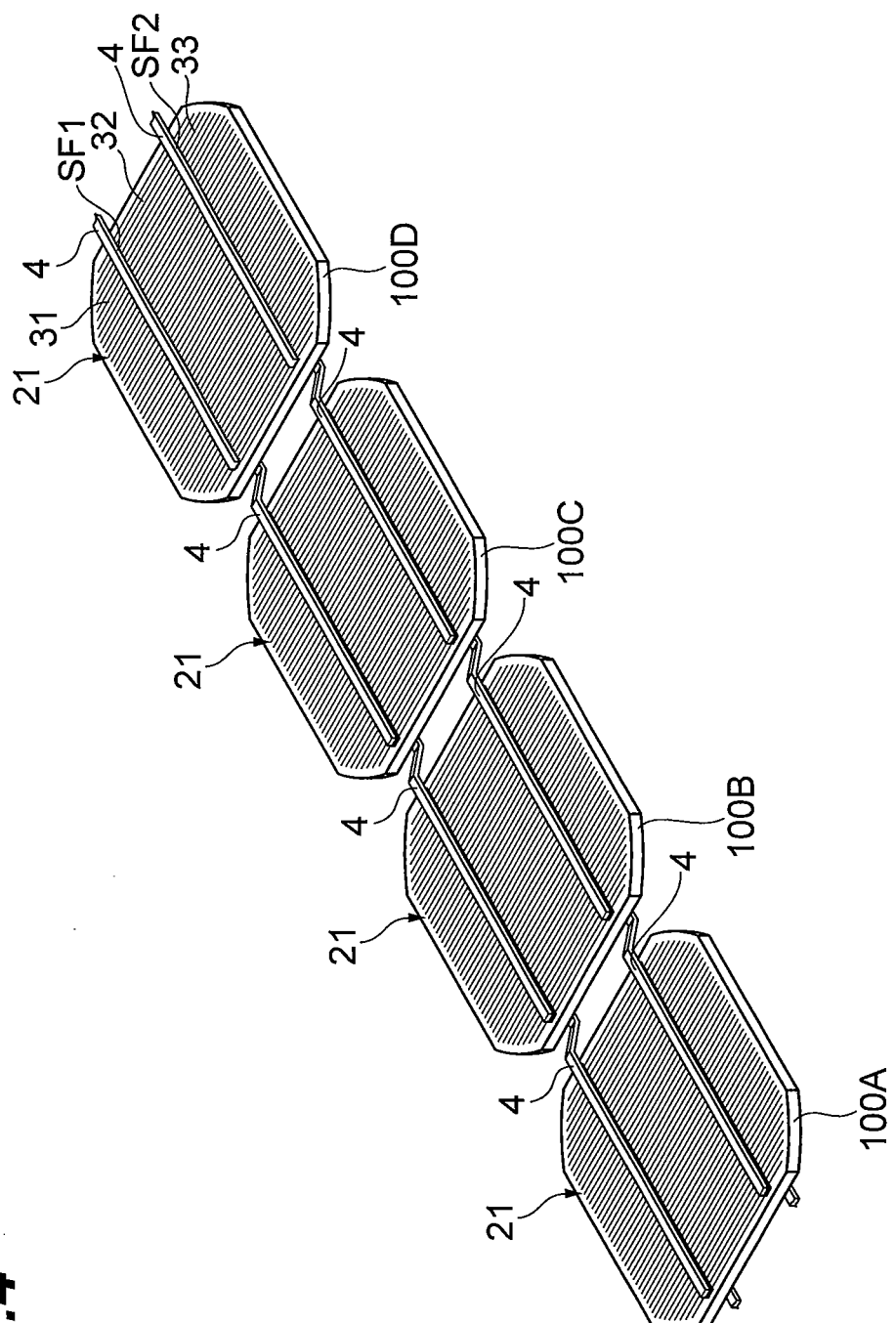
FIG. 4 is a perspective view illustrating a state in which the solar battery cell in FIG. 1 is connected in plurality.
Figure 5:
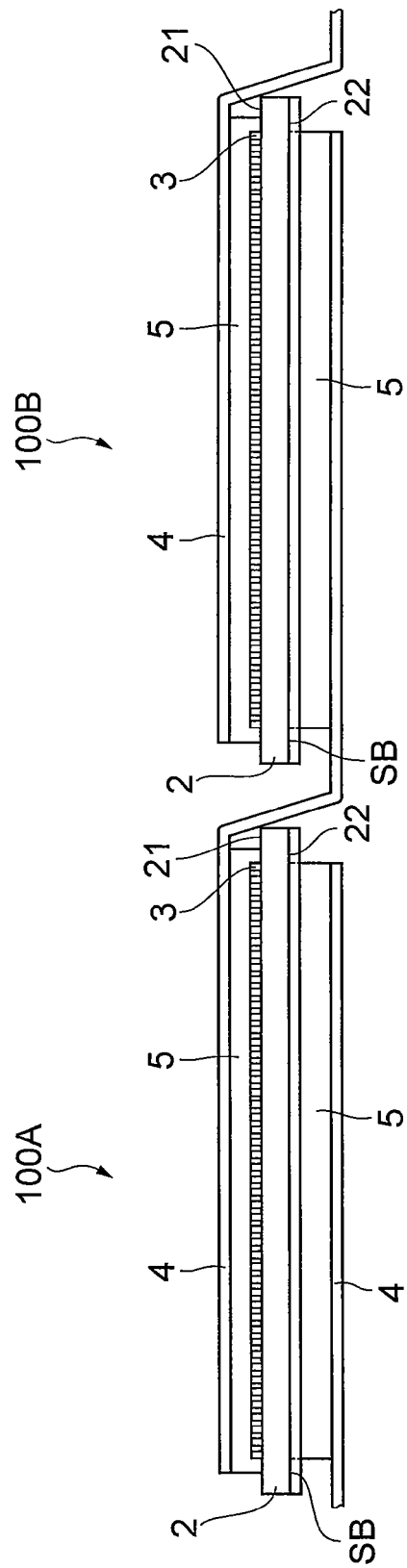
FIG. 5 is a schematic side view of FIG. 4.

FIG. 1 is a plan view illustrating a light receiving surface of the solar battery cell, and FIG. 2 is a diagram illustrating an enlarged view of a TAB area SF1 in FIG. 1. FIG. 3 is a bottom view illustrating the back surface of the solar battery cell in FIG. 1, FIG. 4 is a perspective view illustrating a state in which the solar battery cell in FIG. 1 is connected in plurality, and FIG. 5 is a schematic side view of FIG. 4. In the following descriptions, a direction in which finger electrodes 3 extend is referred to as a first direction D1, and a direction that is orthogonal to the finger electrodes 3 is referred to as a second direction D2.

As depicted in FIG. 1, this solar battery cell 100, which is electrically connected in plurality in series or parallel to form one solar battery module, includes a substrate 2. The substrate 2 is approximately square and has four circular-arc corners. One surface of the substrate 2 corresponds to a light receiving surface 21, and the other surface thereof corresponds to a back surface 22 (see FIG. 3). The substrate 2 is made of at least one of monocrystalline silicon, polycrystalline silicon, and amorphous silicon, for example. The light receiving surface 21 of the substrate 2 may be formed of an n-type semiconductor or may be formed of a p-type semiconductor. The distance between the two opposite edges of the substrate 2 is 125 millimeters, for example.

A plurality of linear finger electrodes 3 are arranged on the light receiving surface 21 in a manner parallel to and separated from each other. When the solar battery cell 100 is connected in plurality to form the solar battery module, two TAB wires 4 are connected to the finger electrodes 3 by respective conductive adhesion films (conductive adhesives) 5 (see FIG. 5). Areas on the light receiving surface 21 where the TAB wires 4 are connected to the finger electrodes 3 are referred to as TAB areas SF. The two TAB wires 4 are connected to the respective finger electrodes 3 in the TAB areas SF in a manner extending in the direction (second direction D2) orthogonal to the finger electrodes 3. Accordingly, the TAB areas SF include a TAB area SF1 and a TAB area SF2 that extend in the second direction D2 and to which the respective two TAB wires 4 are connected.

The width we of the TAB areas SF1 and SF2 is 1.5 millimeters, for example. The distance df between the TAB area SF1 and the TAB area SF2 is 62 millimeters, for example. It should be noted in the present embodiment that the term TAB areas SF alone indicates both the TAB area SF1 and the TAB area SF2.

The finger electrodes 3 include a plurality of first finger electrodes and a plurality of second finger electrodes that reach to the TAB areas SF from the respective opposite directions in the first direction D1. More specifically, the finger electrodes 3 are divided into finger electrodes 31, finger electrodes 32, and finger electrodes 33 at the TAB areas SF1 and SF2.

The finger electrodes 31 extend from positions inside one end of the solar battery cell 100 to the TAB area SF1. The finger electrodes 31 extend from positions, for example, a few millimeters to tens of millimeters inside the end of the solar battery cell 100. The finger electrodes 33 extend from positions inside the other end of the solar battery cell 100 to the TAB area SF2. The finger electrodes 33 extend from positions, for example, a few millimeters to tens of millimeters inside the other end of the solar battery cell 100. In FIG. 1, when focusing on the TAB area SF1, the first finger electrodes correspond to the finger electrodes 31 and the second finger electrodes correspond to the finger electrodes 32. When focusing on the TAB area SF2, the first finger electrodes correspond to the finger electrodes 32 and the second finger electrodes correspond to the finger electrodes 33.

As depicted in FIG. 2, the finger electrodes 31 and the finger electrodes 32 are provided alternately in the second direction D2 in the TAB area SF1. In addition, the finger electrodes 31 and the finger electrodes 32 overlap in the second direction D2, and all the finger electrodes 31 and the finger electrodes 32 that are adjacent to each other in the second direction D2 are separated from each other. These separation distances can be all the same. Ends of the finger electrodes 31 reaching the TAB area SF1 and ends of the finger electrodes 32 reaching the TAB area SF1 are aligned on two lines that define the TAB area SF1 in the first direction D1 and are parallel to the second direction D2. Accordingly, the length l of overlap between the finger electrodes 31 and the finger electrodes 32 is approximately the same as the width of the TAB area SF1. More specifically, the ends of the finger electrodes 31 reaching the TAB area SF1 are aligned on the line on the finger electrodes 32 side out of the two lines defining the TAB area SF1 in the first direction D1, and the ends of the finger electrodes 32 reaching the TAB area SF1 are aligned on the line on the finger electrodes 31 side out of the two lines defining the TAB area SF1 in the first direction D1. The length l of the overlap between the finger electrodes 31 and the finger electrodes 32 is 1.5 millimeters, for example. In addition, the ends of the finger electrodes 31 reaching the TAB area SF1 and the ends of the finger electrodes 32 reaching the TAB area SF1 are positioned at the equal distance from the center C of the TAB area SF1 in the width direction (first direction D1).

Although omitted in the drawings, the finger electrodes 3 are similarly configured also in the TAB area SF2. More specifically, the finger electrodes 32 and the finger electrodes 33 are alternately provided in the second direction D2 in the TAB area SF2. In addition, the finger electrodes 32 and the finger electrodes 33 overlap in the second direction D2, and all the finger electrodes 32 and the finger electrodes 33 that are adjacent to each other in the second direction D2 are separated from each other. These separation distances can be all the same. Ends of the finger electrodes 32 reaching the TAB area SF2 and ends of the finger electrodes 33 reaching the TAB area SF2 are aligned on lines that define the TAB area SF2 in the first direction D1. Accordingly, the length of overlap between the finger electrodes 32 and the finger electrodes 33 is approximately the same as the width of the TAB area SF2. More specifically, the ends of the finger electrodes 32 reaching the TAB area SF2 are aligned on the line on the finger electrodes 33 side out of the two lines defining the TAB area SF2 in the first direction D1, and the ends of the finger electrodes 33 reaching the TAB area SF2 are aligned on the line on the finger electrodes 32 side out of the two lines defining the TAB area SF2 in the first direction D1. The length of the overlap between the finger electrodes 32 and the finger electrodes 33 is 1.5 millimeters, for example. In addition, the ends of the finger electrodes 32 and the ends of the finger electrodes 33 reaching the TAB area SF2 are positioned at the equal distance from the center C of the TAB area SF2 in the width direction (first direction D1).

The width of the conductive adhesion films 5 used for connecting the TAB wires 4 to the respective TAB areas SF1 and SF2 is 1.2 millimeters, for example.

Each of the finger electrodes 3 is made of a known material providing electrical continuity. Examples of the material of the finger electrode 3 include a glass paste containing silver; a silver paste, a gold paste, a carbon paste, a nickel paste, and an aluminum paste each containing an adhesive resin with various types of conductive particles dispersed therein; ITO formed by burning or deposition; and gold plating, silver plating, copper plating, and nickel plating each formed by plating. Among these materials, the glass paste containing silver is preferably used in terms of heat resistance, electrical conductivity, stability, and costs.

The line width of the finger electrodes 31, the finger electrodes 32, and the finger electrodes 33 is 0.10 millimeter, for example. In addition, the distance df between the finger electrodes 31 that are adjacent to each other in the second direction D2, the distance df between the finger electrodes 32 that are adjacent to each other in the second direction D2, and the distance df between the finger electrodes 33 that are adjacent to each other are 2.55 millimeters, for example. Accordingly, the distance dh between the finger electrodes 31 and the finger electrodes 32 in the TAB area SF1, and the distance dh between the finger electrodes 32 and the finger electrodes 33 in the TAB area SF2 are 1.275 millimeters, for example.

As depicted in FIG. 3, a back surface electrode 7 is formed all over the back surface 22 of the solar battery cell 100. When the solar battery cell 100 is connected in plurality to form a solar battery module, the TAB wires 4 are connected to this back surface electrode 7 by the conductive adhesion films 5 (see FIG. 5). The back surface electrode 7 is made of a known material providing electrical continuity. Examples of the material of the back surface electrode 7 include a glass paste containing silver; a silver paste, a gold paste, a carbon paste, a nickel paste, and an aluminum paste each containing an adhesive resin with various types of conductive particles dispersed therein; ITO, aluminum, silver, gold, and nickel each formed by sputtering or deposition; and gold plating, silver plating, copper plating, and nickel plating each formed by plating. Among these materials, the aluminum paste is preferably used in terms of heat resistance, electrical conductivity, stability, and costs. Finger electrodes may also be provided on the back surface in the same manner as on the front surface.

Positions of connection areas SB1 and SB2 to which the TAB wires 4 are connected on the back surface 22 correspond to the positions of TAB areas SF1 and SF2 to which the TAB wires 4 are connected on the light receiving surface 21. The width wc of the connection areas SB1 and SB2 is the same as the width of the TAB wires 4 connected to the connection areas SB1 and SB2, and is 1.5 millimeter, for example. The distance dc between the connection areas SB1 and SB2 is about 62 millimeters, for example, similarly to the light receiving surface 21. The width of the conductive adhesion films 5 used for connecting the TAB wires 4 to the connection areas SB1 and SB2 is about 1.2 millimeters, for example, similarly to when adhering the TAB wires to the light receiving surface 21.

In the solar battery cell 100, with the finger electrodes 31 and the finger electrodes 32 reaching to the TAB area SF1 from opposite directions in the first direction D1, it is possible to render the TAB area SF1 visually conspicuous by the ends of the finger electrodes 31 and the ends of the finger electrodes 32. Similarly, with the finger electrodes 32 and the electrodes 33 reaching to the TAB area SF2 from opposite directions in the first direction D1, it is possible to render the TAB area SF2 visually conspicuous by the ends of the finger electrodes 32 and the ends of the finger electrodes 33. Accordingly, it is possible to identify each of the TAB area SF1 and the TAB area SF2 without additional alignment marks formed, and thus it is possible to accurately connect the TAB wires to the TAB area SF1 and the TAB area SF2 while preventing an increase in the amount of electrode material usage.

Furthermore, in the solar battery cell 100, the finger electrodes 31 and the finger electrodes 32 overlap in the extending direction of the TAB area SF1 (second direction D2), and also the finger electrodes 32 and the finger electrodes 33 overlap in the extending direction of the TAB area SF2 (second direction D2). The lengths l of these overlaps are approximately the same as the width of the TAB area SF1 and the width of the TAB area SF2, respectively. Accordingly, the overlap between the finger electrodes 31 and the finger electrodes 32 and the section where the finger electrodes 32 and the finger electrodes 33 respectively matches the width of the TAB area SF1 and the TAB area SF2, and thus the overlap between the finger electrodes 31 and the finger electrodes 32 can be distinctly displayed as the width of the TAB area SF1, and the overlap between the finger electrodes 32 and the finger electrodes 33 can be distinctly displayed as the width of the TAB area SF2. Thus, the TAB wires 4 can be more accurately connected to the TAB area SF1 and the TAB area SF2.

Furthermore, in the solar battery cell 100, the ends of the finger electrodes 31 reaching the TAB area SF1 and the ends of the finger electrodes 32 reaching the TAB area SF1 are positioned at the same distance from the center C of the TAB area SF1 in the width direction (first direction D1), and also the ends of the finger electrodes 32 reaching the TAB area SF2 and the ends of the finger electrodes 33 reaching the TAB area SF2 are positioned at the same distance from the center C of the TAB area SF2 in the width direction (first direction D1). By this positioning, the centers of areas sandwiched between the ends of the finger electrodes 31 reaching the TAB area SF1 and the end of the finger electrodes 32 reaching the TAB area SF1 coincide with the center of the TAB area SF1, and the centers of areas sandwiched between the ends of the finger electrodes 32 reaching the TAB area SF2 and the ends of the finger electrodes 33 reaching the TAB area SF2 coincide with the center of the TAB area SF2. Accordingly, the centers of the TAB area SF1 and the TAB area SF2 in the width direction can be easily identified, and thus the TAB wires 4 can be accurately connected to the TAB area SF1 and the TAB area SF2.

Furthermore, in the solar battery cell 100, the ends of the finger electrodes 31 reaching the TAB area SF1 and the ends of the finger electrodes 32 reaching the TAB area SF1 are aligned on lines parallel to the second direction D2. By this alignment, the positions of the ends of the finger electrodes 31 reaching the TAB area SF1 or the positions of the ends of the finger electrodes 32 reaching the TAB area SF1 can be rendered visually conspicuous as the positions parallel to the TAB area SF1. Similarly, the positions of the ends of the finger electrodes 32 reaching the TAB area SF2 or the positions of the ends of the finger electrodes 33 reaching the TAB area SF2 can be rendered visually conspicuous as the positions parallel to the TAB area SF2. Accordingly, the TAB wires 4 can be positioned in parallel with the TAB area SF1 and the TAB area SF2, whereby the TAB wires 4 can be accurately connected to the TAB area SF1 and TAB area SF2.

Furthermore, in the solar battery cell 100, the finger electrodes 3 extend in the direction (first direction D1) orthogonal to the extending direction of the TAB area SF (second direction D2). By this, the light collection efficiency of the solar battery cell 100 can be improved.

As depicted in FIG. 4, the solar battery cell 100 is aligned in plurality so that the TAB areas SF1 and SF2, to which the TAB wires 4 on the light receiving surface 21 are connected, run along a straight line, and are coupled by the TAB wires 4 arranged via the conductive adhesion films 5 in a manner running along the TAB areas SF1 and SF2 to which the TAB wires 4 on the light receiving surface 21 are connected.

This coupling is performed by, in adjacent solar battery cells 100A and 100B, connecting the finger electrodes 31 and the finger electrodes 32 in the TAB area SF1 on the light receiving surface 21 of the one solar battery cell 100A to the back surface electrode 7 in the connection area SB on the back surface 22 of the other solar battery cell 100B with the TAB wire 4 (see FIG. 5), further connecting the finger electrodes 32 and the finger electrodes 33 in the TAB area SF2 on the light receiving surface 21 of the one solar battery cell 100A to the back surface electrode 7 in the connection area SB on the back surface 22 of the other solar battery cell 100B with the TAB wire 4, and repeating these connections. By this, a plurality of solar battery cells 100 arranged on a row are electrically connected in series. By providing such a row in singularity or in plurality, a solar battery module is formed.

Although the preferred embodiments have been described above in detail, the present invention is not limited to the above-described embodiments. Other examples of the above-described embodiments will be described below with reference to FIGS. 6 to 10. Note that FIGS. 7 to 9 are enlarged views of the TAB area SF1 of the solar battery cell 100, and modified examples of the finger electrodes 31 and the finger electrodes 32 will be described with reference to these drawings, but the finger electrodes 32 and the finger electrodes 33 in the TAB area SF2 also are configured in the same manner.

Figure 6:
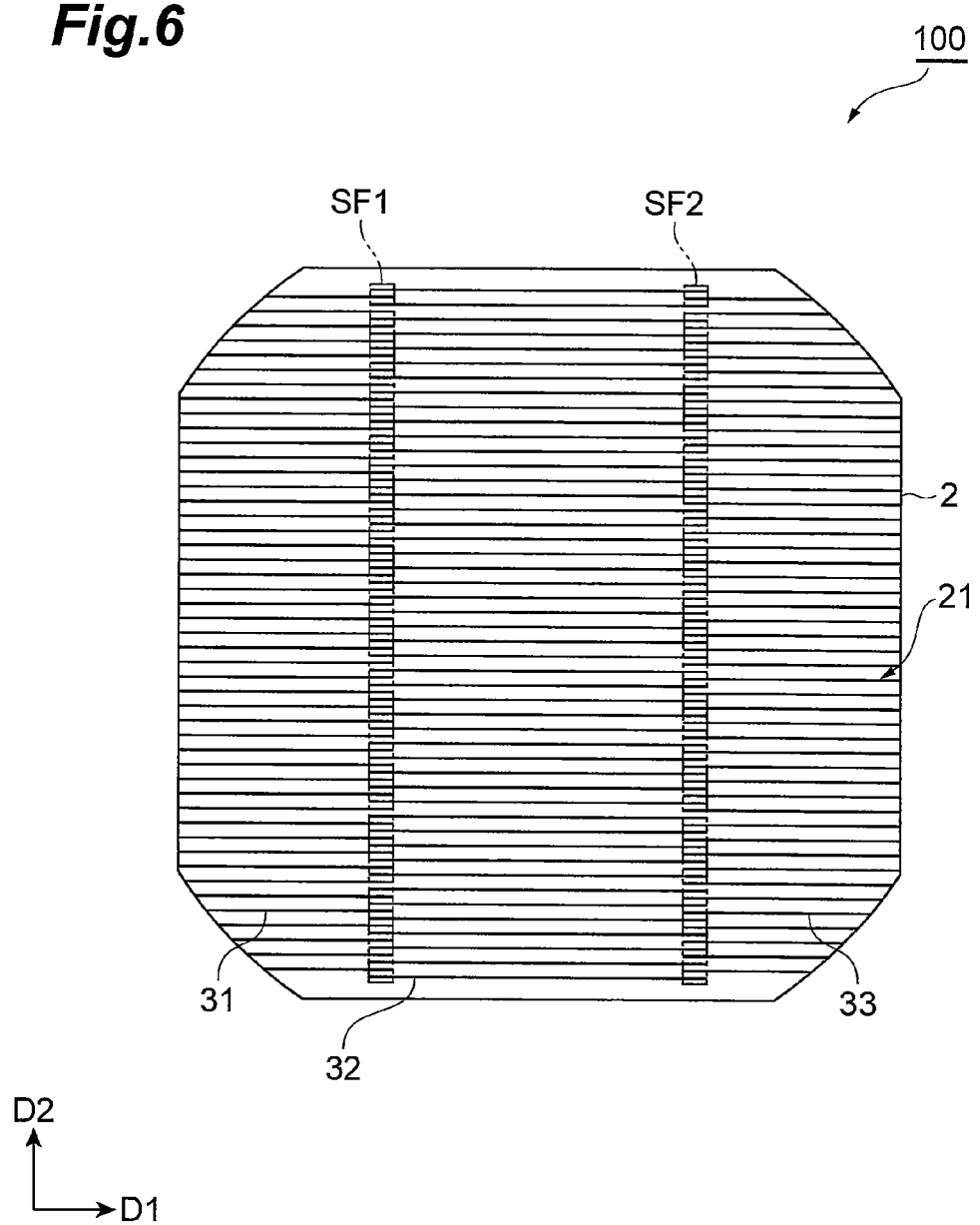
FIG. 6 is a plan view illustrating another example of the solar battery cell of the present embodiment.

In the above-described embodiments, the finger electrodes 31 extend from positions inside one end of the solar battery cell 100 to the TAB area SF1 and the finger electrodes 33 extend from position inside the other end of the solar battery cell 100 to the TAB area SF2, but they are not limited to this. As depicted in FIG. 6, the finger electrodes 31 may extend from one end of the solar battery cell 100 to the TAB area SF1. In addition, the finger electrodes 33 may extend from the other end of the solar battery cell 100 to the TAB area SF2.

In the above-described embodiments, the ends of the finger electrodes 31 reaching the TAB area SF1 and the ends of the finger electrodes 32 reaching the TAB area SF1 are aligned on the lines defining the TAB area SF1 in the first direction D1, but the positions of the ends of the finger electrodes 31 reaching the TAB area SF1 and the ends of the finger electrodes 32 reaching the TAB area SF1 are not limited to this. Even in such a case, similarly to the above-described embodiments, the position of the TAB area can be identified without additional alignment marks formed.

Figure 7:
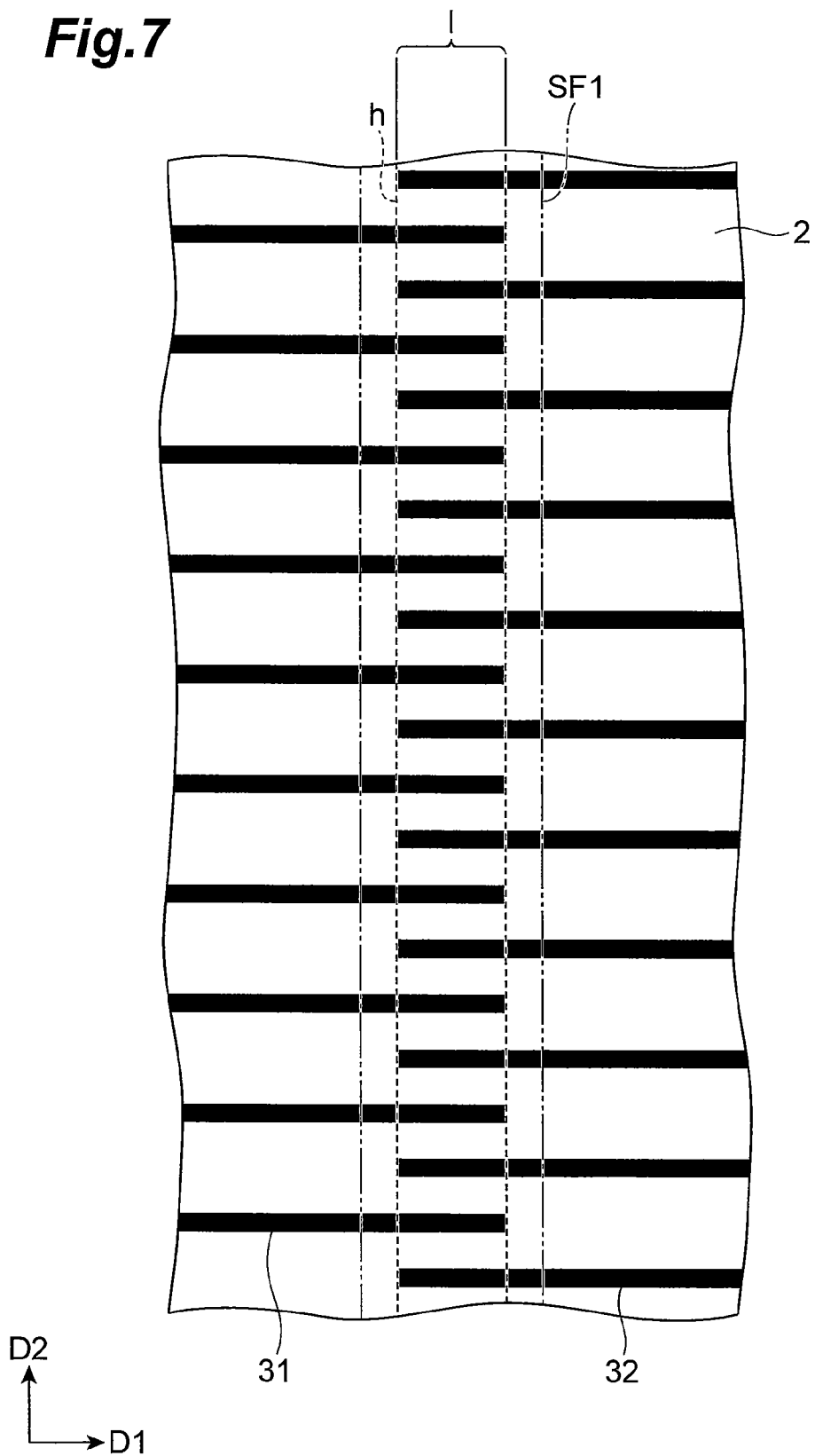
FIG. 7 is a plan view illustrating another example of finger electrodes in the solar battery cell of the present embodiment.
Figure 8:
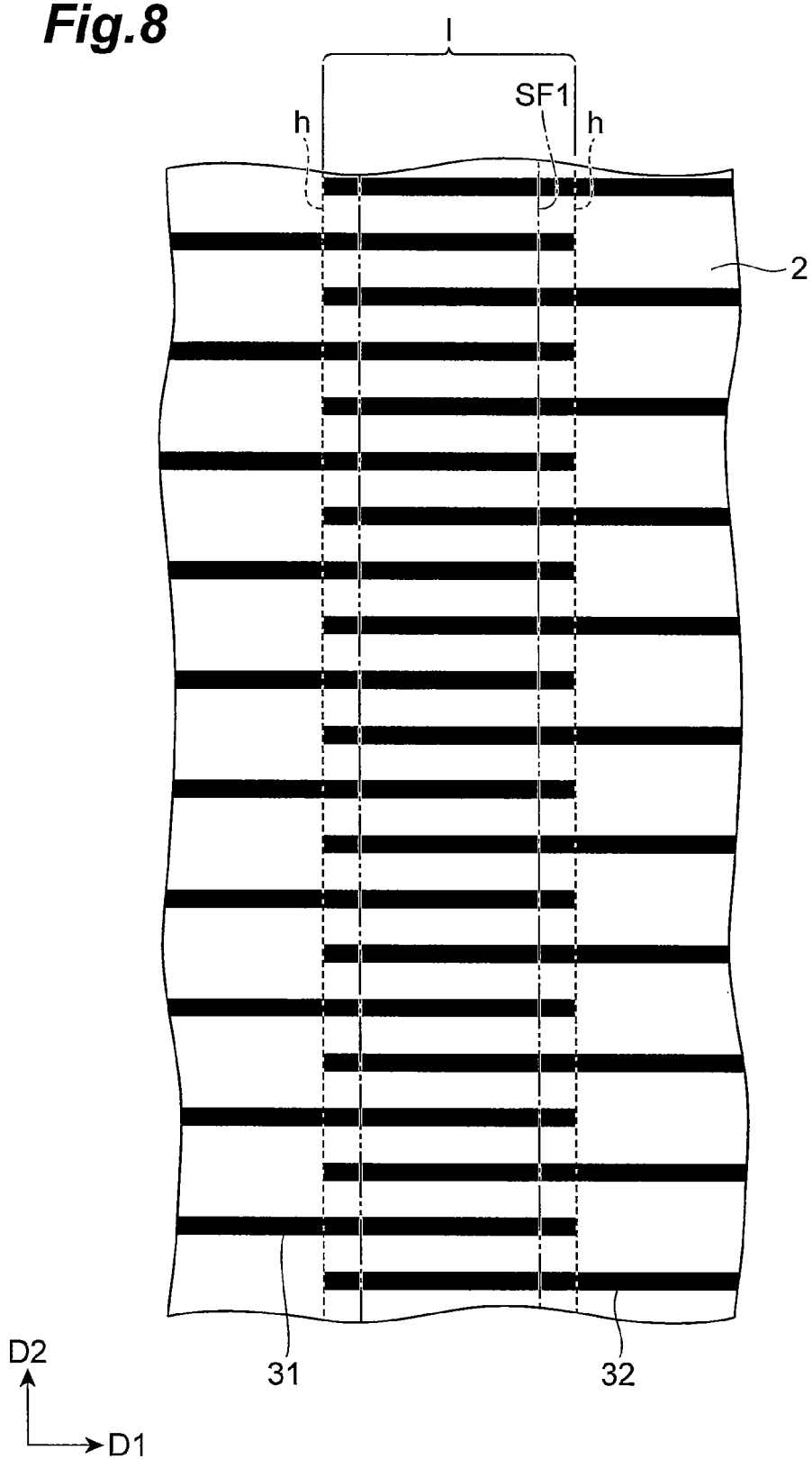
FIG. 8 is a plan view illustrating yet another example of finger electrodes in the solar battery cell of the present embodiment.
Figure 9:
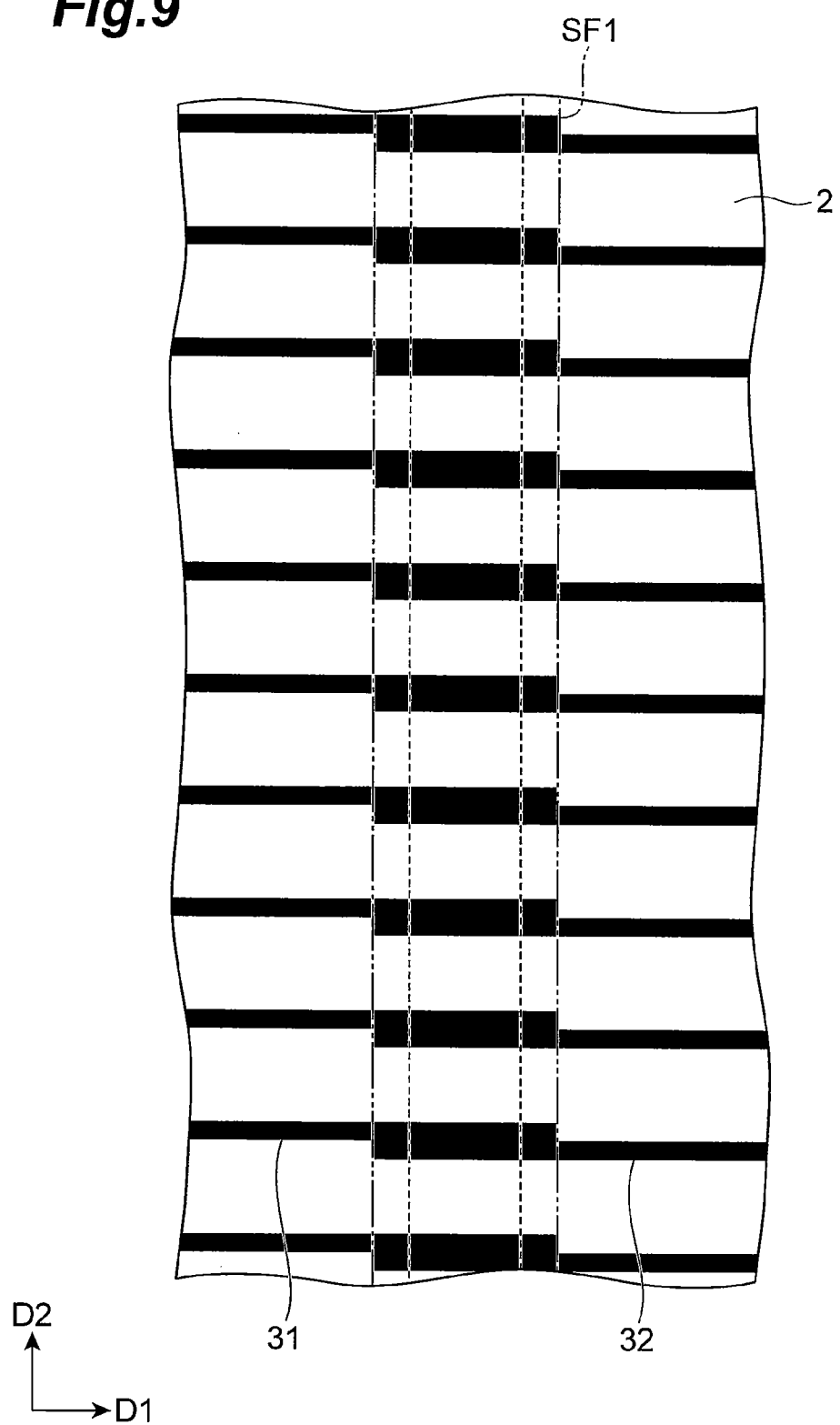
FIG. 9 is a plan view illustrating yet another example of finger electrodes in the solar battery cell of the present embodiment.

As depicted in FIG. 7 and FIG. 8, the ends of the finger electrodes 31 reaching the TAB area SF1 and the ends of the finger electrodes 32 reaching the TAB area SF1 may be positioned inside or outside the TAB area SF1 away from the lines defining the TAB area SF1 in the D1 direction. In this case, the ends of the finger electrodes 31 reaching the TAB area SF1 and the ends of the finger electrodes 32 reaching the TAB area SF1 are preferably aligned on lines (broken lines h) parallel to the extending direction of the TAB area SF1 (second direction D2).

Furthermore, in the above-described embodiments, the length l of the overlap between the finger electrodes 31 and the finger electrodes 32 is approximately the same as the width of the TAB area SF1, but the length l of the overlap is not limited to this. As depicted in FIG. 7, the length l of the overlap may be shorter than the width of the TAB area SF1. Even in this case, the light receiving area will not be smaller because of the finger electrodes 31 and the finger electrodes 32 that are formed longer than the width of the TAB area SF1, and thus it is possible to accurately connect the TAB wire 4 to the TAB area SF1 while improving the light collection efficiency.

When the length l of the overlap between the finger electrodes 31 and the finger electrodes 32 is shorter than the width of the TAB area SF1, it is preferable that the length l of the overlap between the finger electrodes 31 and the finger electrodes 32 be equal to or larger than 10% of the width of the TAB area SF1. By this, sufficient width for identifying the position of the TAB area SF1 can be ensured, whereby the overlap between the finger electrodes 31 and the finger electrodes 32 can be displayed in a visually distinct manner, and the TAB wire 4 can be more accurately connected to the TAB area SF1. In addition, the length of the overlap is preferably 30% or more of the width of the TAB area SF1, and more preferably 50% or more of the width.

Furthermore, the length l of the overlap between the finger electrodes 31 and the finger electrodes 32 may be longer than the width of the TAB area SF1 as depicted in FIG. 8. In this case, the ends of the finger electrodes 31 reaching the TAB area SF1 and the ends of the finger electrodes 32 reaching the TAB area SF1 are positioned sticking out of the TAB area SF1. By this, the TAB wire 4 can be electrically connected to the substrate 2 even if the TAB wire 4 is somewhat misaligned from the TAB area SF1 in the first direction D1 when the TAB wire 4 is connected.

In the above-described embodiments, all the finger electrodes 31 and the finger electrodes 32 that are adjacent to each other in the extending direction of the TAB area SF1 (second direction D2) are separated from each other but, as depicted in FIG. 9, at least a pair of one of the finger electrodes 31 and one of the finger electrodes 32 that are adjacent to each other may be in contact with each other. Even in this case, because of the overlap between the finger electrodes 31 and the finger electrodes 32, the TAB area SF1 can be more distinctly displayed, and the TAB wire 4 can be more accurately connected to the TAB area SF1. Furthermore, in FIG. 9, all the finger electrodes 31 and the finger electrodes 32 that are adjacent to each other in the second direction D2 may be in contact with each other. In this case also, as described above, because of the overlap between the finger electrodes 31 and the finger electrodes 32, the TAB area SF1 can be more distinctly displayed, and the TAB wire 4 can be accurately connected to the TAB area SF1.

Figure 10:
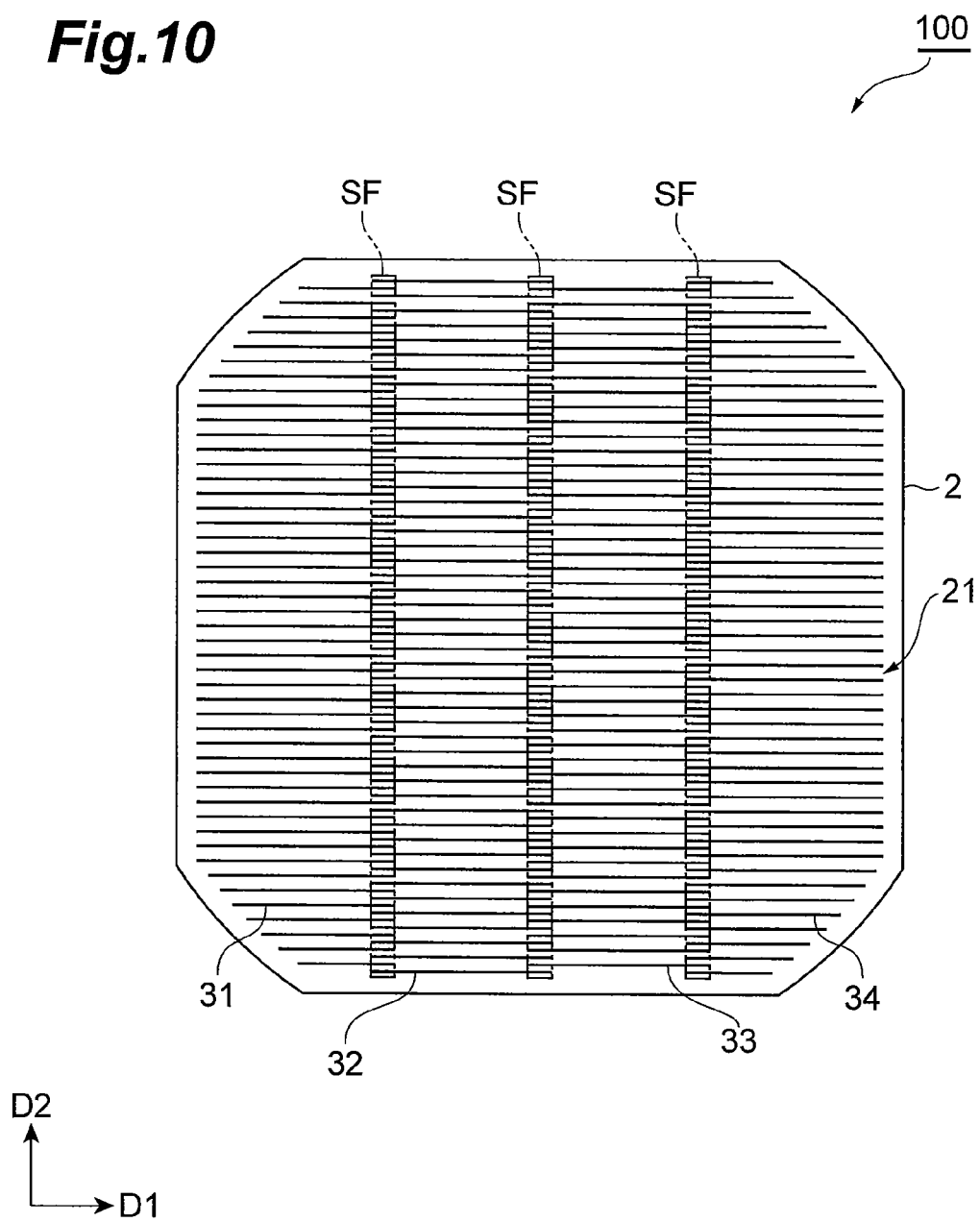
FIG. 10 is a plan view illustrating another example of the solar battery cell of the present embodiment.

Furthermore, in the above-described embodiments, the number of the TAB areas SF (the number of the TAB wires 4 connected to the solar battery cell 100) is two, but the number of the TAB areas SF may be three as depicted in FIG. 10, or may be four or more. In addition, the finger electrodes 3 may be nonlinear, or may be nonparallel to each other.

Furthermore, in the above-described embodiments, the ends of the finger electrodes 31 reaching the TAB area SF1 and the ends of the finger electrodes 32 reaching the TAB area SF1 are positioned at the same distance from the center C of the TAB area SF1 in the width direction (first direction D1), but the ends of the finger electrodes 31 reaching the TAB area SF1 and the ends of the finger electrodes 32 reaching the TAB area SF1 do not have to be positioned at the same distance from the center C. In this case, the distance from the center C to the ends of the finger electrodes 31 reaching the TAB area SF1 may be shorter that to the ends of the finger electrodes 32 reaching the TAB area SF2, or the distance from the center C to the ends of the finger electrodes 32 may be shorter than that to the ends of the finger electrodes 31.

Furthermore, in the above-described embodiments, the first direction D1 in which the finger electrodes 3 extend is orthogonal to the extending direction of the TAB area SF1 (second direction D2), the second direction D2 crossing the finger electrodes 3, but the first direction D1 does not necessarily have to be orthogonal to the second direction D2.

Furthermore, in the above-described embodiments, the ends of the finger electrodes 31 reaching the TAB area SF1 and the ends of the finger electrodes 32 reaching the TAB area SF1 are aligned on lines parallel to the second direction D2, but they do not necessarily have to be aligned on lines parallel to the second direction if the position of the TAB area SF1 can be displayed without additional alignment marks formed.

Furthermore, in the above-described embodiments, the conductive adhesion films 5 in a film shape are used as conductive adhesives, but liquid conductive adhesions may be applied instead. Moreover, in the above-described embodiments, a conductive adhesive is used as the adhesive, but an insulating adhesive may also be used as the adhesive. Moreover, in the above-described embodiments, bus bar electrodes or alignment marks may be formed on the front or back surface of the solar battery cell.

REFERENCE SIGNS LIST

3 . . . finger electrodes, 4 . . . TAB wires, 5 . . . conductive adhesion films (conductive adhesives), 7 . . . back surface electrode, 21 . . . light receiving surface, 22 . . . back surface, 31, 32, 33,34 . . . finger electrodes, 100, 100A, 100B, 100C, 100D . . . solar battery cell, SF, SF1, SF2 . . . TAB area(s)

The invention claimed is:

1. A solar battery cell comprising:
a plurality of linear finger electrodes arranged on a light receiving surface on a substrate in parallel,
the finger electrodes including a plurality of straight first finger electrodes and a plurality of straight second finger electrodes extending from opposite sides to reach a TAB area which crosses the finger electrodes and which has TAB wires connected thereto,
wherein the first finger electrodes and the second finger electrodes overlap in the extending direction of the TAB area,
wherein the first finger electrodes and the second finger electrodes are alternately provided in an extending direction of the TAB area in the TAB area, and
wherein a portion of the first finger electrode that overlaps a portion of the second finger electrodes is physically separated from the portion of the second finger electrode.

2. The solar battery cell according to claim 1, wherein the finger electrodes extend in a direction orthogonal to the TAB area.

3. The solar battery cell according to claim 1, wherein ends of the first finger electrodes reaching the TAB area and ends of the second finger electrodes reaching the TAB area are aligned on lines parallel to an extending direction of the TAB area.

4. The solar battery cell according to claim 1, wherein ends of the first finger electrodes reaching the TAB area and ends of the second finger electrodes reaching the TAB area are positioned at an equal distance from center of the TAB in a width direction thereof.

5. The solar battery cell according to claim 1, wherein at least a pair of one of the first finger electrodes and one of the second finger electrodes that are adjacent to each other in the extending direction of the TAB area are in contact with each other.

6. The solar battery cell according to claim 1, wherein all the finger electrodes that are adjacent to each other in the extending direction of the TAB area are separated from each other.

7. The solar battery cell according to claim 1, wherein length of overlap between the first finger electrodes and the second finger electrodes is equal to or smaller than width of the TAB.

8. The solar battery cell according to claim 7, wherein the length of overlap between the first finger electrodes and the second finger electrodes is approximately the same as the width of the TAB area.

9. The solar battery cell according to claim 1, wherein length of overlap between the first finger electrodes and the second finger electrodes is equal to or larger than 10% of width of the TAB area.

* * * * *